United States Patent
Kang et al.

(10) Patent No.: US 12,302,641 B2
(45) Date of Patent: May 13, 2025

(54) OPTIMIZATION OF A DIGITAL PATTERN FILE FOR A DIGITAL LITHOGRAPHY DEVICE

(71) Applicant: Applied Materials, Inc., Santa Clara, CA (US)

(72) Inventors: Chung-Shin Kang, San Jose, CA (US); Thomas L. Laidig, Richmond, CA (US); Yinfeng Dong, San Jose, CA (US); Yao-Cheng Yang, Mountain View, CA (US); Chen-Chien Hung, Tainan (TW); Shivaraj Gururaj Kamalapura, Sunnyvale, CA (US); Tsaichuan Kao, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 557 days.

(21) Appl. No.: 17/636,998

(22) PCT Filed: Sep. 23, 2019

(86) PCT No.: PCT/US2019/052449
§ 371 (c)(1),
(2) Date: Feb. 21, 2022

(87) PCT Pub. No.: WO2021/061092
PCT Pub. Date: Apr. 1, 2021

(65) Prior Publication Data
US 2022/0367438 A1    Nov. 17, 2022

(51) Int. Cl.
*G06F 30/398* (2020.01)
*G03F 7/00* (2006.01)
*H10D 89/10* (2025.01)

(52) U.S. Cl.
CPC ......... *H10D 89/10* (2025.01); *G03F 7/70433* (2013.01); *G06F 30/398* (2020.01)

(58) Field of Classification Search
USPC .......................................................... 716/54
See application file for complete search history.

(56) References Cited

U.S. PATENT DOCUMENTS

| | | | |
|---|---|---|---|
| 11,003,828 B1 * | 5/2021 | Mousa | G06F 30/392 |
| 2004/0205684 A1 * | 10/2004 | Gothoskar | G06F 30/394 |
| | | | 716/51 |

(Continued)

FOREIGN PATENT DOCUMENTS

| | | |
|---|---|---|
| CN | 101297390 A | 10/2008 |
| CN | 101770529 A | 7/2010 |

(Continued)

OTHER PUBLICATIONS

Japanese Office Action for Application No. 2022-518269 dated May 30, 2023.

(Continued)

*Primary Examiner* — Bryce M Aisaka

(57) ABSTRACT

A digital pattern generation system comprises a memory and a controller. The controller is coupled the memory and is configured to remove redundant cells from a digital pattern file, generate a first updated digital pattern file and compare the first updated digital pattern file with the digital pattern file. Further a number of vertexes of a first arc of the first updated digital pattern file is reduced to generate a second updated digital pattern file. Additionally, a first cell of the second updated digital pattern file is replaced with an alternative version of the first cell to generate a third updated digital pattern file. Further, one or more polygons within the third updated digital pattern file is converted to one or more quad polygons to generate an optimized digital pattern file.

20 Claims, 6 Drawing Sheets

(56) References Cited

U.S. PATENT DOCUMENTS

| | | |
|---|---|---|
| 2007/0009808 A1 | 1/2007 | Abrams et al. |
| 2015/0227671 A1 | 8/2015 | Yu et al. |
| 2016/0211118 A1 | 7/2016 | Yashima |
| 2017/0090301 A1 | 3/2017 | Verma et al. |
| 2018/0068049 A1 | 3/2018 | Tsai et al. |
| 2018/0267399 A1 | 9/2018 | Quaglio et al. |
| 2019/0042685 A1 | 2/2019 | Hsieh et al. |

FOREIGN PATENT DOCUMENTS

| | | |
|---|---|---|
| JP | H10261568 A | 9/1998 |
| JP | 2011197445 A | 10/2011 |
| JP | 2012129479 A | 7/2012 |
| KR | 20150120265 A | 10/2015 |
| WO | 2014167750 A1 | 10/2014 |

OTHER PUBLICATIONS

Chinese Office Action for Application No. 201980099993.3 dated Jun. 27, 2023.
International Search Report and Written Opinion for Application No. PCT/US2019/052449 dated Jun. 30, 2020.
Korean Office Action dated Feb. 23, 2024 for Application No. 10-2022-7013592.
Japanese Office Action dated Jan. 30, 2024 for Application No. 2022-518269.

\* cited by examiner

OPTIMIZATION OF A DIGITAL PATTERN FILE FOR A DIGITAL LITHOGRAPHY DEVICE

BACKGROUND

Field

Embodiments of the present disclosure generally relate to generating design files for a digital lithography system.

Description of the Related Art

Lithography methods are used in the manufacturing of semiconductor devices. Conventional lithography methods include transferring design patterns onto a set of photomasks which are transferred onto a photoresist. The photomasks are examined to verify the accuracy and quality of the photomasks in view of the original design. However, transferring the design patterns onto a set of photomasks and verifying the accuracy and quality of the photomasks is a time consuming and a costly process. In a digital lithography process, design patterns are digitized directly onto the photoresist using an imaging process. Additionally, the digital lithography process includes a verification process to verify the accuracy of the design patterns and to optimize the design patterns for the imaging process. However, the verification and optimization process is time consuming and processing intensive.

Accordingly, what is needed in the art is an improved method for optimizing and verifying design files.

SUMMARY

In one example, a method for optimizing a digital pattern file for a digital lithography device comprises removing redundant cells from the digital pattern file to generate a first updated digital pattern file and comparing the first updated digital pattern file with the digital pattern file. The method further comprises reducing a number of vertexes of a first arc of the first updated digital pattern file to generate a second updated digital pattern file and comparing the second updated digital pattern file with the first updated digital pattern file. Additionally, the method comprises replacing a first cell of the second updated digital pattern file with an alternative version of the first cell to generate a third updated digital pattern file and comparing the third updated digital pattern file with the second digital pattern file. Further, the method comprises converting one or more polygons within the third updated digital pattern file to one or more quad polygons to generate an optimized digital pattern file and comparing the optimized digital pattern file with the third updated digital pattern file.

In one example, a computer program product for generating a digital pattern file comprises a computer-readable storage medium having computer-readable program code embodied therewith. The computer-readable program code is executable by one or more computer processors to remove redundant cells from a digital pattern file to generate a first updated digital pattern file and compare the first updated digital pattern file with the digital pattern file. Further, the number of vertexes of a first arc of the first updated digital pattern file is reduced to a second updated digital pattern file and the second updated digital pattern file is compared with the first updated digital pattern file. Additionally, a first cell of the digital pattern file is replaced with an alternative version of the first cell to generate a third updated digital pattern file and the third updated digital pattern file is compared with the second updated digital pattern file. Further, one or more polygons within the third updated digital pattern file is converted to one or more quad polygons to generate an optimized digital pattern file and the optimized digital pattern file is compared with the third updated digital pattern file.

In one example, a digital pattern generation system comprising a memory and a controller. The memory controller comprises a digital pattern file. The controller is coupled the memory and is configured to remove redundant cells from the digital pattern file to generate a first updated digital pattern file and compare the first updated digital pattern file with the digital pattern file. The controller is further configured to reduce a number of vertexes of a first arc of the first updated digital pattern file to generate a second updated digital pattern file and compare the second updated digital pattern file with the first updated digital pattern file. Additionally, the controller is configured to replace a first cell of the second updated digital pattern file with an alternative version of the first cell to generate a third updated digital pattern file and compare the third updated digital pattern file with the second updated digital pattern file. The controller is further configured to convert one or more polygons within the third updated digital pattern file to one or more quad polygons to generate an optimized digital pattern file and compare the optimized digital pattern file with the third updated digital pattern file.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a system and method for optimizing a design file (digital pattern file) with reduced processing resources. The method includes dividing the optimization process into multiple steps and varying the digital pattern file between each step. Accordingly, errors in the optimization process may be detected and corrected before the optimization process has been completed. Further, dividing optimization process into smaller steps reduces the processing and time requirements as compared to processing of the full design file.

Figure 1:
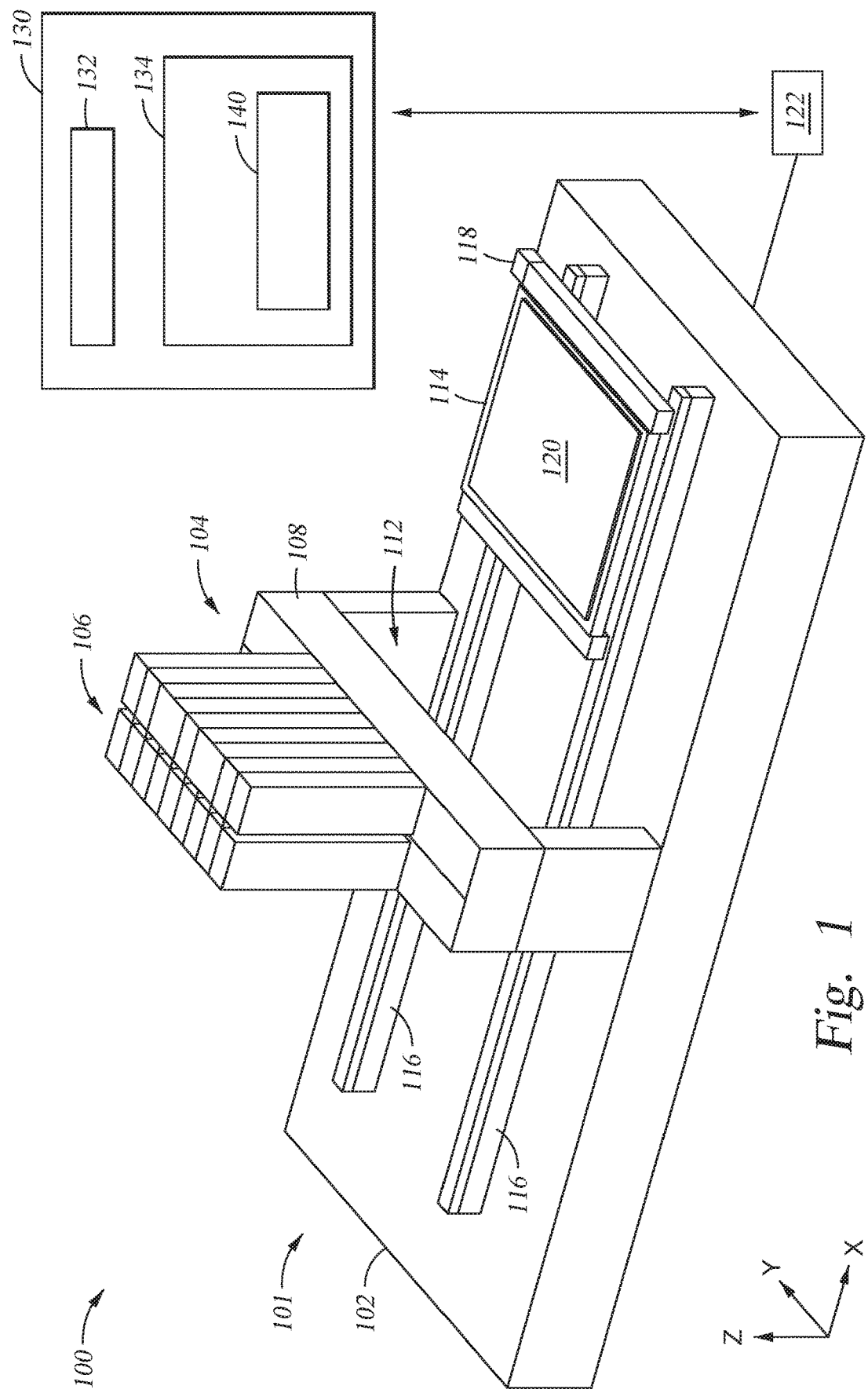
FIG. 1 is a perspective view of a lithography system, according to one or more embodiments.

FIG. 1 illustrates a digital lithography system 100, according to one or more embodiments. The system 100 includes a digital lithography device 101 and optimizer 130. The digital lithography device 101 includes a stage 114 and a processing apparatus 104. The stage 114 is supported by a pair of tracks 116 disposed on a slab 102. A substrate 120 is supported by the stage 114. The stage 114 is supported by a pair of tracks 116 disposed on the slab 102. The stage 114 moves along the pair of tracks 116 in the X direction as indicated by the coordinate system shown in FIG. 1. The pair of tracks 116 may be a pair of parallel magnetic channels. As shown, each track of the pair of tracks 116 extends in a straight line path. An encoder 118 is coupled to the stage 114 in order to provide information of the location of the stage 114 to a controller 122.

The controller 122 is generally designed to facilitate the control and automation of the processing techniques described herein. The controller 122 may be coupled to or in communication with the processing apparatus 104, the stage 114, and the encoder 118. The processing apparatus 104 and the encoder 118 may provide information to the controller 122 regarding the substrate processing and the substrate aligning. For example, the processing apparatus 104 may provide information to the controller 122 to alert the controller 122 that substrate processing has been completed. The controller 122 facilitates the control and automation of a digital lithography process based on a digital pattern file provided by the optimizer 130. The digital pattern file (or computer instructions), which may be referred to as an imaging design file, readable by the controller 122, determines which tasks are performable on a substrate. The digital pattern file (e.g., the digital pattern file 140) includes a mask pattern data and code to monitor and control the processing time and substrate position. The mask pattern data corresponds to a pattern to be written into the photoresist using electromagnetic radiation output by the digital lithography device 101.

The substrate 120 comprises any suitable material, for example, glass, which may be used as part of a flat panel display. In other embodiments, the substrate 120 is made of other materials capable of being used as a part of the flat panel display or other semiconductor devices. The substrate 120 has a film layer to be patterned formed thereon, such as by pattern etching thereof, and a photoresist layer formed on the film layer to be patterned, which is sensitive to electromagnetic radiation, for example UV or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. After exposure of the photoresist to the electromagnetic radiation, the resist is developed to leave a patterned photoresist on the underlying film layer. Then, using the patterned photoresist, the underlying thin film is pattern etched through the openings in the photoresist to form a portion of the electronic circuitry of the display panel.

The processing apparatus 104 includes a support 108 and a processing unit 106. The processing apparatus 104 straddles the pair of tracks 116 and is disposed on the slab 102, and thereby includes an opening 112 for the pair of tracks 116 and the stage 114 to pass under the processing unit 106. The processing unit 106 is supported over the slab 102 by a support 108. The processing unit 106 may be a pattern generator configured to expose photoresist in a photolithography process. In some embodiments, the pattern generator is configured to perform a maskless lithography process. Further, the processing unit 106 may include a plurality of image projection systems.

During operation, the stage 114 moves in the X direction from a loading position, as shown in FIG. 1, to a processing position. The processing position is one or more positions under the processing unit 106. Herein, the digital lithography device 101 is schematically shown, wherein the digital lithography device 101 is sized to be capable of exposing the entire width of the photoresist layer on the substrate 120 in the Y direction, i.e. the substrate 120 is small compared to those of an actual flat panel display substrate. However, in an actual processing system, the processing apparatus 104 will be significantly smaller, in the Y direction, than the width of the substrate 120 in the Y direction, and the substrate 120 will be sequentially moved in the −X direction under the processing apparatus 104, moved or stepped in the +Y direction, scanned backed in the +X direction under the processing apparatus 104. This X direction scanning and Y direction stepping operation will continue until the entire substrate area has passed under the writable area of the processing apparatus 104.

The optimizer 130 includes a controller 132 and a memory (e.g., data store) 134. The optimizer 130 may be utilized to generate, optimize, verify, and/or update a digital pattern file 140. The digital pattern file 140 may be stored within the memory 134. The digital pattern file 140 includes design data that may be utilized by the digital lithography device 101 to pattern the substrate 120.

The controller 132 retrieves and executes programing data stored in the memory 134 and coordinates operations of other system components. Similarly, the controller 132 stores and retrieves application data residing in the memory 134. The controller 132 may be one or more central processing units (CPUs). Alternatively, or additionally, the controller 132 may be one or more application specific software programs.

The memory 134 may store instructions and logic to be executed by the controller 132. Further, the memory 134 may be one or more of a random access memory (RAM) and a non-volatile memory (NVM). The NVM may be a hard disk, a network attached storage (NAS), and a removable storage device, among others. Further, the digital pattern file 140 is stored within the memory 134.

The digital pattern file 140 is stored within the memory 134 and is accessible by the controller 132. The digital pattern file 140 may include design data that when interpreted by the controller 122 of the digital lithography device 101 provides instructions of how to pattern the substrate 120. The digital pattern file 140 may be provided in different formats. For example, the format of the digital pattern file 140 may be one of a GDS format, and an OASIS format, among others. Further, the digital pattern file 140 may be provided to the controller 122 as a bitmap or another image file. The design data of the digital pattern file 140 includes information corresponding to the structures of patterns to be generated on a substrate (e.g., the substrate 120). The digital pattern file 140 may include areas of interest which correspond to one or more structural elements. The structural elements may be constructed as geometrical shapes. Further, areas of interest may be represented as cell during a verification and/or optimization process.

The optimizer 130 may be coupled with the digital lithography device 101. For example, the optimizer 130 may transmit digital pattern files, e.g., the digital pattern file 140, to the digital lithography device 101 to be used during a lithography process to pattern the substrate 120. The digital pattern file 140 may be communicated to the digital lithography device 101 via a local area network (LAN). Alternatively, a digital pattern file 140 may be loaded on a removable memory and loaded onto the digital lithography device 101. The digital pattern file 140 may provide coordinates of polygons which define structures of a corresponding design layout. The structures may be organized within a hierarchy which may be referenced to make arrays. Further, the digital pattern file 140 defines layers which correspond to layers of the corresponding semiconductor device. For example, the layers may comprise contact pads, traces, etc. Further, the digital pattern file 140 may include a grouping of cells, which is a logical grouping of elements. For example, a cell may be a grouping of the logical elements of a transistor or another element of a semiconductor device. Additionally, a cell may contain geometrical objects such as polygons (boundaries, paths, and other cells. Objects in the cells are assigned to "layers" of the corresponding design. The different layers may represent different processing steps within a lithography process. A cell may be referenced whenever that element is to be drawn. For example, a cell corresponding to a transistor may be referenced whenever a transistor is to be drawn. Further, a cell may span one or more layers within the design of the design file. A cell hierarchy may include one or more cells. For example, a top level cell may include all elements of the corresponding object, and each cell within lower levels of the hierarchy may include elements of a different part of the object.

Figure 2A:
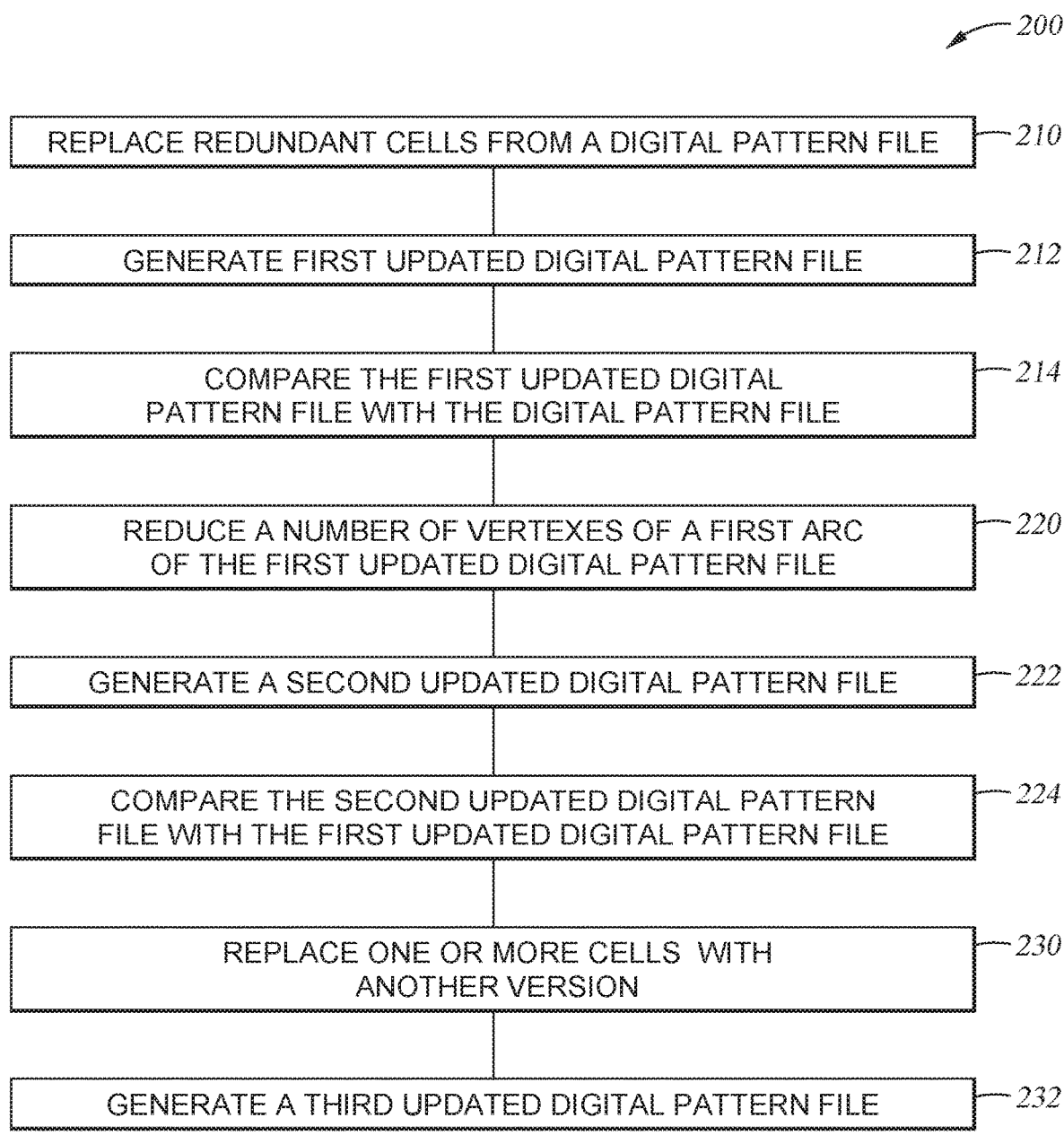
FIGS. 2A and 2B are flow chart of a method for verifying a digital pattern file, according to one or more embodiments.
Figure 2B:
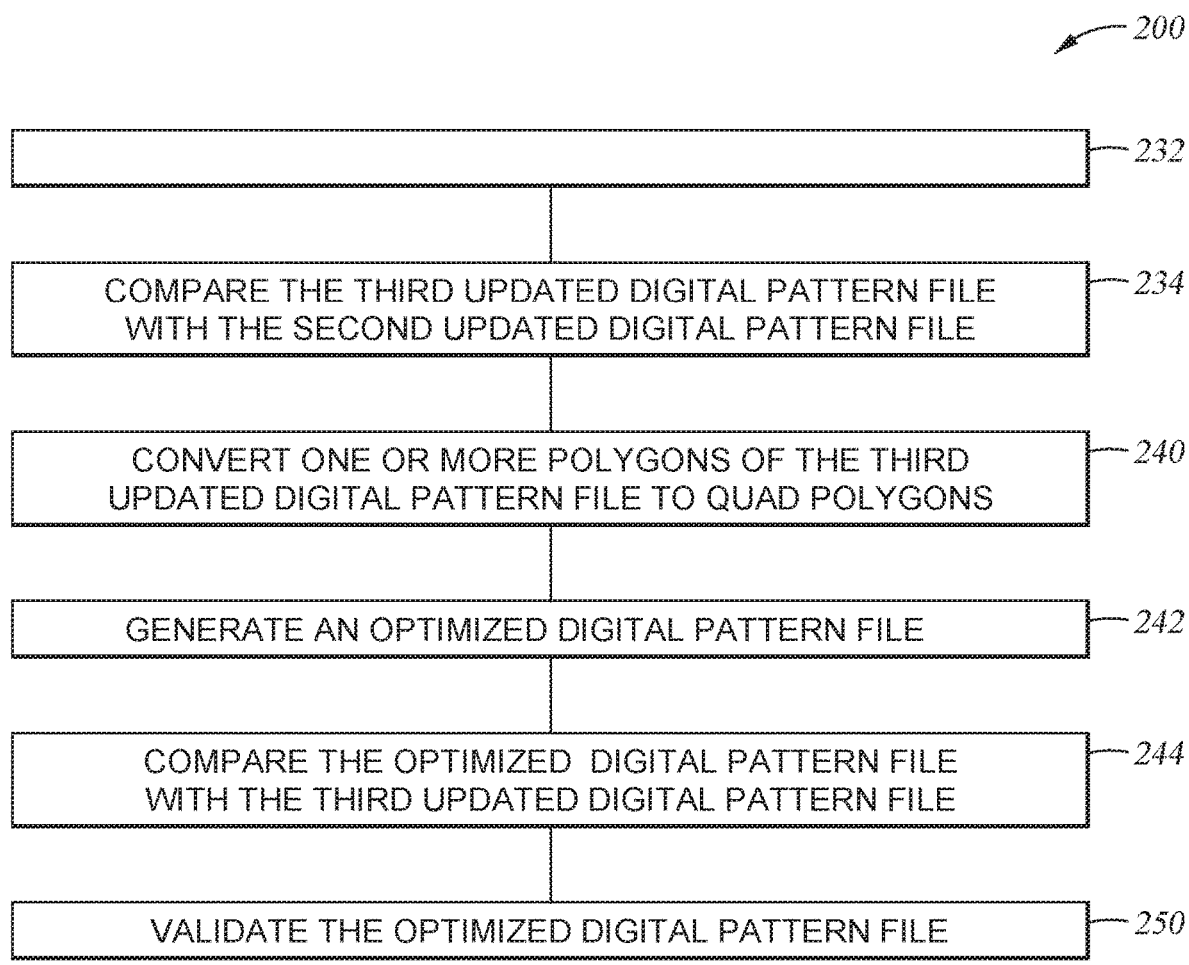
Figure 3:
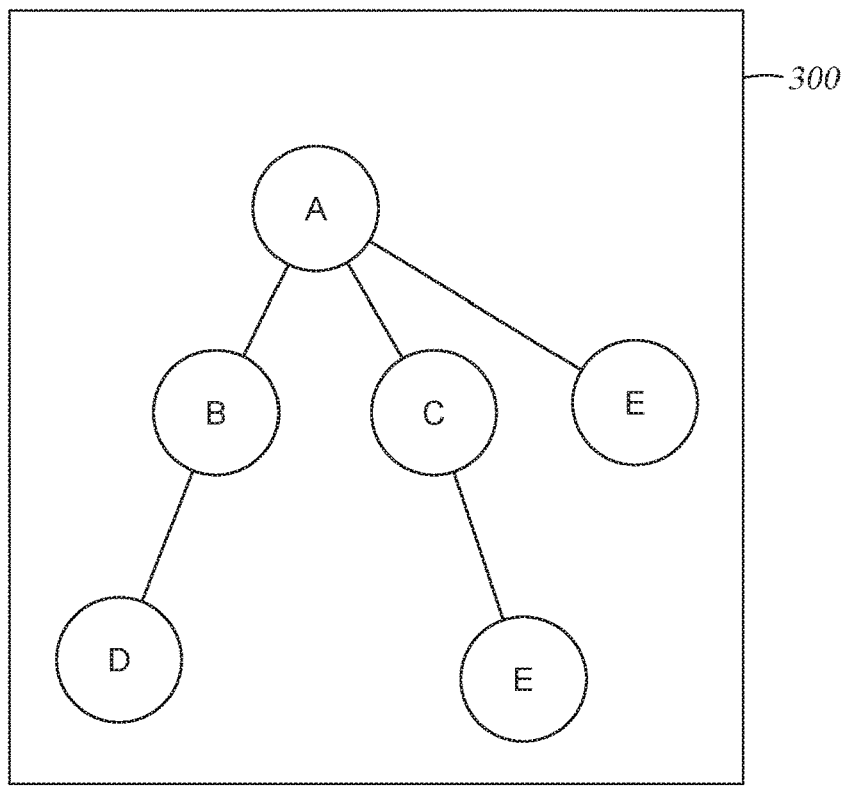
FIG. 3 illustrates example cell structures before and after equivalence update, according to one or more embodiments.
Figure 3:
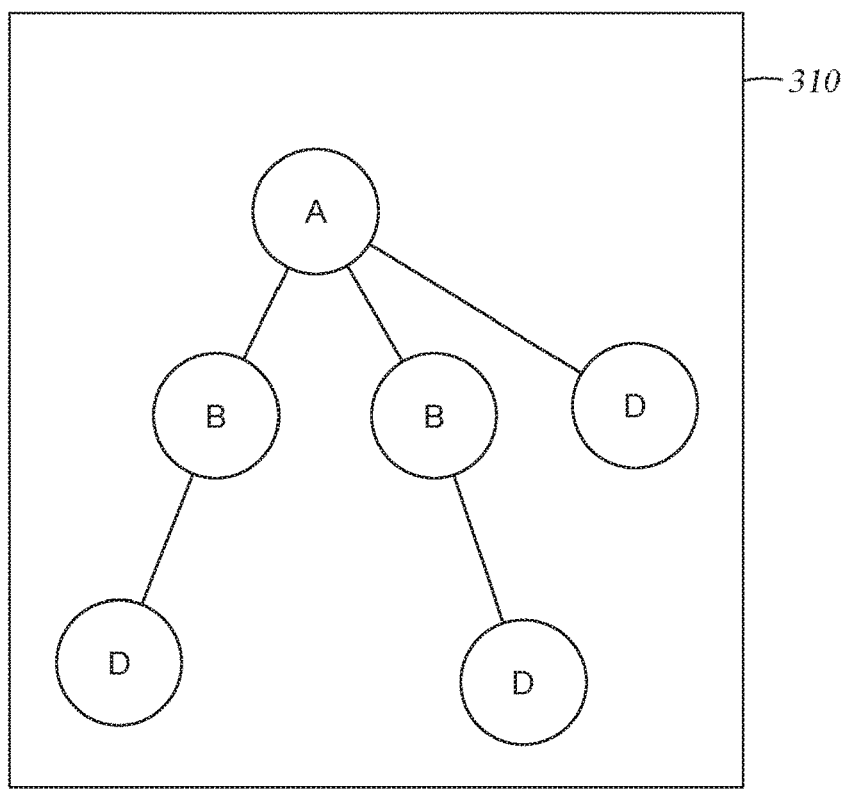

FIGS. 2A and 2B illustrate a method 200 for inspecting a digital pattern file, e.g., the digital pattern file 140, according to one or more embodiments. At operation 210, redundant cells are replaced within a digital pattern file. For example, the optimizer 130 may be configured to identify one or more cells within the design layout of the digital pattern file 140 that are redundant with another cell. FIG. 3 illustrates a cell structure 300 and a cell structure 310. The cell structure 300 includes cells A, B, C, D, and E which are part of a common element. For example, cell A may be the top level of the hierarchy of the cell structure 300 and cells B, C, D, and E correspond to lower levels of the hierarchy of the cell structure 300. The cell structure 310 may be generated by identifying one or more cells within the cell structure 300 that are redundant and replacing those redundant cells with equivalent cells. For example, the optimizer 130 examines the cell structure 300 and identifies that cell D and cell E are redundant. Stated another way, the cell D is determined to be equivalent to the cell E as they correspond to the same element type of the digital pattern file 140. Accordingly, the cell E may be replaced by the cell D, generating the cell structure 310. Further, cells B and C are also determined to be equivalent and redundant. Thus, cell C may be replaced with cell B, generating the cell structure 310. According, the cell structures 300 and 310 are equivalent. Replacing the cell C with the cell B and the cell E with the cell D simplifies compression and other processing applied to the corresponding digital pattern file as fewer cells are processed during the optimization and verification tasks. For example, the cell structure 310 is comprised of three cells while the cell structure 300 is comprised of five cells. Thus, a digital pattern file including the cell structure 310 requires less processing than digital pattern files include the cell structure 300.

At operation 212, a first updated digital pattern file is generated in response to replacing the redundant cells. For example, the controller 132 may generate the first updated digital pattern file to include the updated cell structures generated by replacing the redundant cells as described with regard to operation 210.

At operation 214, the first updated digital pattern file is compared with the digital pattern file 140, performing a hierarchically comparison, to detect errors within first updated digital pattern file. The controller 132 may perform a comparison of the contents of the top cell of the first updated digital pattern file with the top cell of digital pattern file to detect pattern differences within the updated digital pattern file. An error (e.g., a pattern difference between the digital pattern files) may be detected within the cell or within any of its parent cells. The number of errors may be compared to an error threshold to determine whether not to verify the first updated digital pattern file. For example, the error threshold may be zero. Alternatively, the error threshold may be one or more. Further, the optimizer 130 may alert a user to correct any identified errors. For example, the optimizer 130 may generate an error report that may be presented to the user.

At operation 220, vertexes within one or more arcs of the first updated digital pattern is reduced. Reducing the vertexes within one or more arcs may include using fewer vertexes to represent an arc. For example, an arc may be replaced with an arc having a smaller vertex count. The optimizer 130 may identify one or more arcs within the first updated digital pattern and reduce the number of vertexes that are used to form the one or more arcs. Reducing the number of vertexes are used to form an arc reduces the amount of data representing the arc and simplifies the corresponding design file. Accordingly, optimization of the design file will generate less quad geometry and require less processing time.

Arcs may be formed by grouping one or more vertexes as part of common arc when the corresponding segments of the vertexes are within a chord tolerance (e.g., chord threshold). For example, arcs may be generated by identifying consecutive vertexes (e.g., points along a boundary) that corresponds to a common center and have a chord distance that is less than the chord tolerance. Vertexes that meet the parameters are group together to form a common arc. Further, vertexes that do not meet these parameters are not grouped to form the arc and may identify the boundaries of the arc. The vertexes and chords of the arc may be used to form quad polygons which may be utilized within the digital pattern file to represent the arcs.

The chord tolerance may be about the same as the length of an input chord. For example, the chord tolerance is the same as the length of an input chord when using an inscribe method. In an inscribe method, the segment ends touch the arc. Alternatively, the controller 132 may utilize a straddle method to reduce the effective output chord error by half. The straddle method allows the output chord tolerance to be about two times the length of the input chord. In the straddle method, the chords forming an arc intersect the arc at the center of the line segment.

Figure 4:
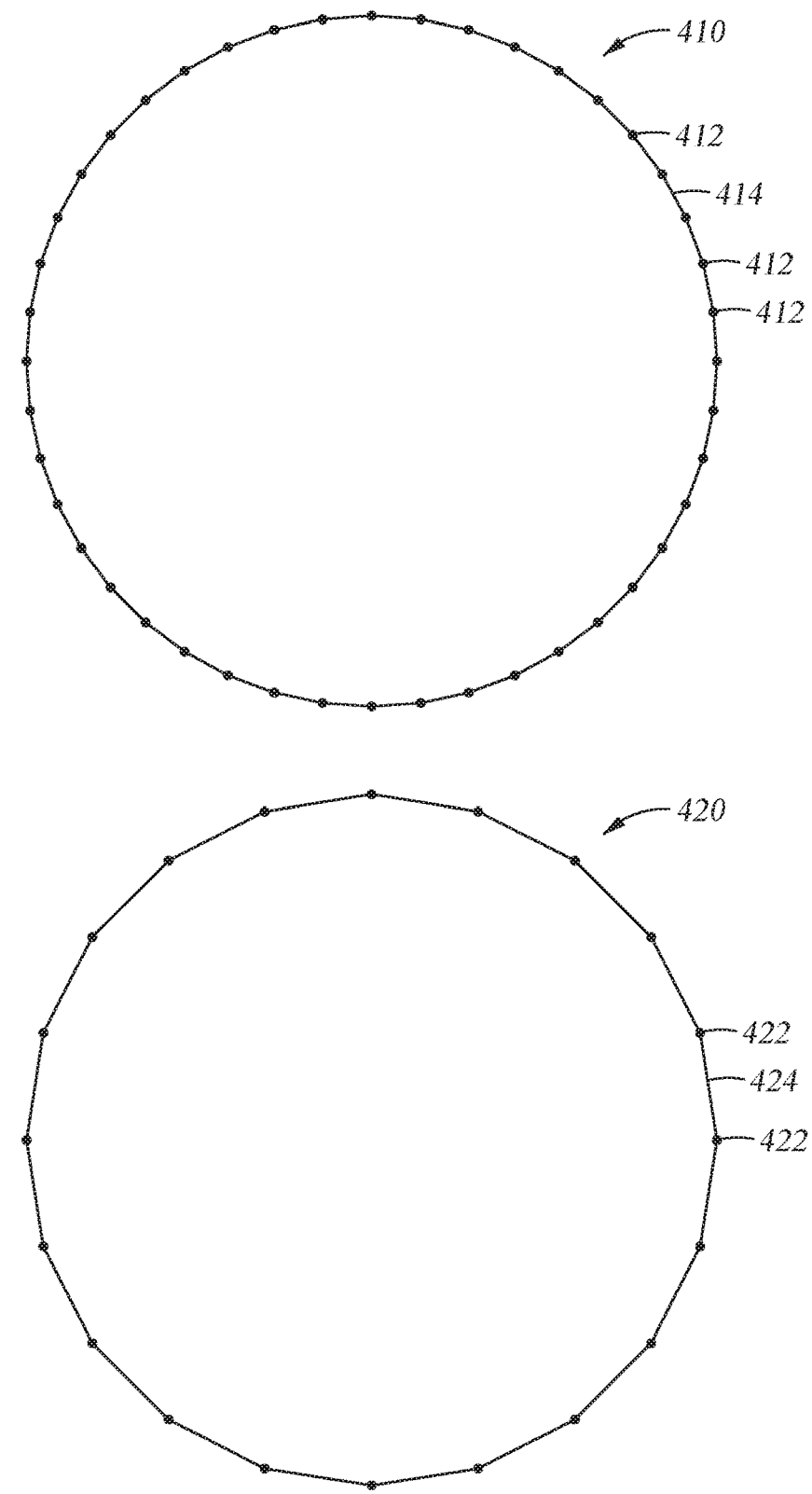
FIG. 4 illustrates example arcs, according to one or more embodiments.

FIG. 4 illustrates arcs 410 and 420. The arc 410 is formed from vertexes 412 and may be considered non-optimized.

The distance between adjacent ones of the vertexes 412 is based on the length of chord 414. For example, the length of the chord 414 may be about 0.05 um. Alternatively, the length of the chord 414 may be less than about 0.05 um or greater than about 0.05 um. Further, the number of vertexes 412 utilized to form the arc 410 may be about 40 or more. However, as the number of vertexes and chords used to represent an arc increases, the amount of data that corresponds to the arc also increases. Thus, the optimization process utilized to optimize the corresponding digital pattern file is processing intensive. However, by reducing the number of vertexes and chords utilize to form the arcs, the amount processing to optimize the digital pattern file is reduced. Further, replacing the arc 410 with an arc having less vertexes and/or chords simplifies the corresponding design file and reduces the processing to optimize the digital pattern file. For example, the arc 410 may be replaced with arc 420 which is formed from vertexes 422 and chords 424, where the number of vertexes 422 is less than the number of vertexes 412. Further, the number of chords 424 is less than the number of chords 414 and the length of chords 424 is greater than the length of chords 414. Accordingly, less data represents arc 420 than arc 410 and less processing is utilized to optimize a digital pattern file comprising the arc 420 than a digital pattern file comprising the arc 410. Replacing the arc 410 with the arc 420 may include reducing the number of vertexes and/or increasing the chord length to form the arc 420.

At operation 222, a second updated digital pattern file is generated in response to the reducing the number of vertexes within one or more arcs. For example, the controller 132 may generate the second updated digital pattern file to include the arcs formed from the reduced number of vertexes.

At operation 224, the optimizer 130 may compare updated cells within the second updated digital pattern file with corresponding cells in the first updated digital pattern file. For example, the optimizer 130 may compare the second updated digital pattern file with the first updated pattern file to detect errors within second updated digital pattern file. The optimizer 130 may perform an arc recovery process to determine if the number of arcs within second updated digital pattern file is equal to the number of arcs within the first updated digital pattern file. The arc recovery process may include generating a projection from the center of each arc to each vertex. The projections formed from the arcs of the second updated digital pattern file are compared to the projections formed from the arcs of the first updated digital pattern file to detect any deviations between the projections. Deviations of greater than a threshold amount may indicate that the second updated digital pattern file has a different number of arcs than the first updated digital pattern file. The threshold may be about 0.05 um. Alternatively, the threshold may be less than half of the allowed output chord error when a straddle method is used. Further, the threshold may be greater than about 0.05 um or less than about 0.05 um. Further, the optimizer 130 may alert a user to correct any identified errors. For example, the optimizer 130 may generate an error report that may be output (e.g., displayed) to a user.

Figure 5:
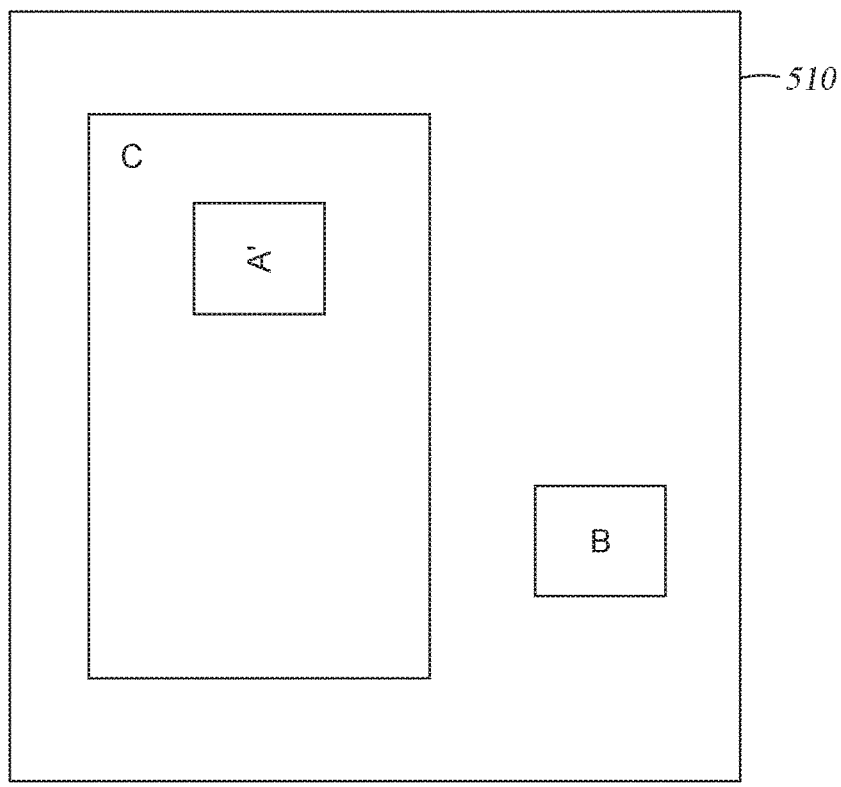
FIG. 5 illustrates an example cell structure transformation, according to one or more embodiments.
Figure 5:
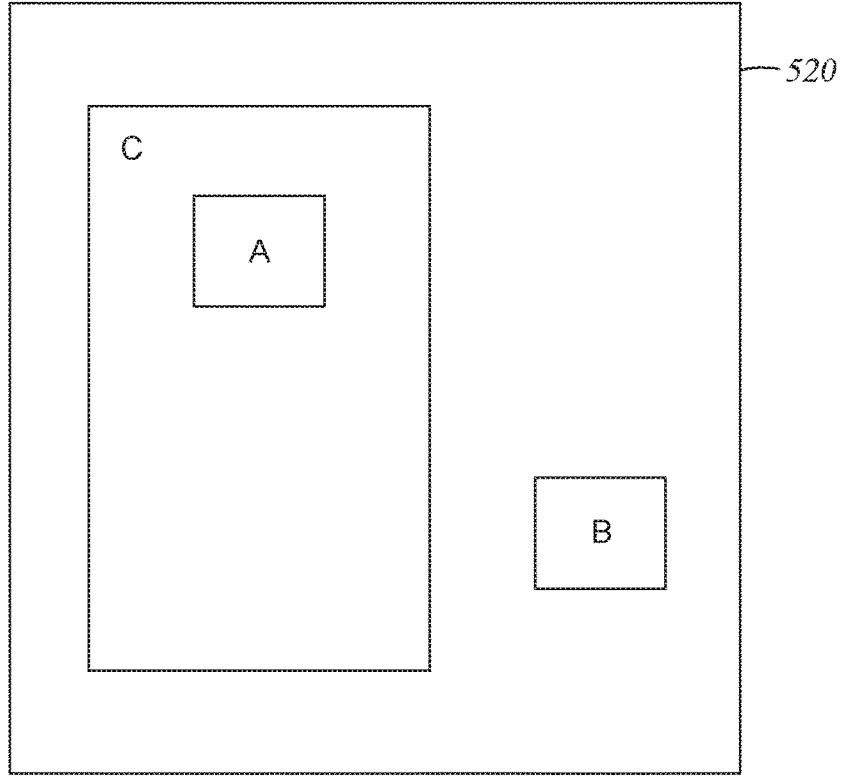

At operation 230, cells placed with rotation, scaling, or mirroring are replaced with an equivalent cell which can be placed without the rotation, scaling and mirroring. For example, the optimizer 130 identifies one or more cells within the second updated design pattern that were placed with rotation, scaling, or mirroring and the identified cells are replaced with a rotated variant of the cell which can be placed without rotation, scaling and mirroring. For example, the cell A' of cell structure 510 of FIG. 5 is equivalent to a rotated version of cell A of cell structure 520 of FIG. 5 from the top-level view. Thus, the cell A' placed with rotation may be replaced with cell A without rotation. For example, cell A' placed with 90 degree rotation may be determined to be replaced with a 90 degree variant of the cell A placed without rotation. Accordingly, the cell A' may be replaced with the cell A if cell A' has rotation and cell A is a 90 degree variant of cell A'. Replacing a cell with a variant reduces the complexity of the corresponding digital pattern file.

At operation 232, a third updated digital pattern file is generated in response to the replacing cells with rotated versions of the cells. For example, the optimizer 130 may generate the third updated digital pattern file to include cell structures At operation 234, the third updated digital pattern file is compared with the second digital pattern file to detect errors within third updated digital pattern file. For example, the controller 132 of the optimizer 130 may perform a comparison of the contents of the top cell of the third updated digital pattern file with the top cell of second digital pattern file to detect pattern differences within the third updated digital pattern file. An error may be stored within the cell or within any of its parent cells. The number of errors may be compared to an error threshold to determine whether not to verify the first updated digital pattern file. For example, the error threshold may one or more. Alternatively, the error threshold may be greater than zero. Further, the optimizer 130 may alert a user to correct any identified errors. Further, the optimizer 130 may alert a user to correct any identified errors. For example, the optimizer 130 may generate an error report that may be output (e.g., displayed) to a user.

At operation 240, one or more polygons of the third updated digital pattern file are converted to quad polygons. For example, the optimizer 130 may identify one or more polygons within the third updated digital pattern file and convert the identified polygons to quad polygons. The controller 132 may employ one of a Manhattan algorithm and a nearby vertex search to convert polygons into quad polygons. The Manhattan algorithm may include converting each polygon to a Manhattan approximation where each side of the quad polygon is horizontal or vertical. The nearby vertex search utilizes the existing vertex to construct the corresponding quad polygon. Accordingly, the nearby vertex search may have a reduced chance of breaking up line segments, producing fewer quads as compared to other methods. The Manhattan algorithm or the nearby vertex search may be selected to be used for the conversion of the polygons into quad polygons based on the area, angle and aspect ratio of the polygons. The determination to use the Manhattan algorithm or the nearby vertex search may be made to minimize the overall quad count and/or width.

At operation 242, an optimized digital pattern file is generated in response to converting the polygons to quad polygons. For example, the optimizer 130 may generate the optimized digital pattern file to include the generated quad polygons.

At operation 244, the optimized digital pattern file is compared to the third updated digital pattern file. For example, the optimizer 130 may compare the optimized digital pattern file with the third digital pattern file to identify any errors within the optimized digital pattern file. For example, a cell to cell comparison between the optimized digital pattern file with the third digital pattern file is completed by the optimizer 130 to identify errors within the optimized digital pattern file. An error may correspond to a difference between patterns within the cells being greater than a grid threshold. The number of errors may be compared to an error threshold, to determine whether not to verify the first updated digital pattern file. For example, the error threshold may be zero. Alternatively, the error threshold may be one or more. Further, the optimizer 130 may alert a user to correct any identified errors. For example, the grid threshold may be about 20 nm. The optimizer 130 may alert a user to correct any identified errors. For example, the optimizer 130 may generate an error report that may be output (e.g., displayed) to a user.

Operation 250 is optional. At operation 250, an optimized digital pattern file generated by the operation 242 is been validated. Validating the optimized digital pattern file (e.g., final digital pattern file) may include determining whether or not the optimized digital pattern file satisfies the parameters of the comparison with the third updated digital pattern file. The optimized digital pattern file may be generated by the optimizer 130 from the third updated digital pattern file. Further, the optimized digital pattern file may be communicated to the digital lithography system to be utilized during the patterning of the substrate 120. Alternatively, the optimized digital pattern file may be generated by the controller 122 of the digital lithography device 101. For example, the controller 122 may generate the optimized digital pattern file from the third updated digital pattern file. Further, the optimized digital pattern file may be in the form of a bitmap or other image file type.

The optimizer 130 may be configured to perform a density check on the optimized digital pattern file to determine whether or not the optimized digital pattern file meets requirements corresponding to a corresponding exposure plan, rasterizer cache of the controller 122 and/or takt time (e.g., an average time between the start of production of one unit to the start of production of another unit). For example, the optimizer 130 performs a density check on the final digital pattern file to determine whether or not the third updated digital pattern file may be processed by the controller 122 of the digital lithography device 101. The optimizer 130 may collect the density of the digital pattern by grid. Each grid may contain the load (singleton count plus the repeating cell count), and sum of the overall quad width and number of quads. The load may then be used to predict whether the rasterizer cache of the controller 122 can hold the incoming data. The total quad width and count may be used for predicting takt time. Further, the optimizer 130 may parse the final optimized digital pattern and calculate the overall reference count of repeating cells plus the singleton count to predict the exposure plan time.

The methods presented in FIGS. 2A and 2B may be stored within a computer program product and executed on a controller of an optimizer (e.g., the controller 132 of the optimizer 130). The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may include the memory 134. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, or a floppy disk, among others.

Computer readable program instructions described herein can be downloaded to respective computing/processing devices from a computer readable storage medium or to an external computer or external storage device via a network, for example, the Internet, a local area network, a wide area network and/or a wireless network. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to the controller 122 and/or the controller 132. Further, the computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in the memory 134.

While the foregoing is directed to examples of the present disclosure, other and further examples of the disclosure may be devised without departing from the basic scope thereof, and the scope thereof is determined by the claims that follow.

What is claimed is:

1. A method for optimizing a digital pattern file for a digital lithography device, the method comprising:
   removing redundant cells from the digital pattern file to generate a first updated digital pattern file;
   comparing the first updated digital pattern file with the digital pattern file;

reducing a number of vertexes of a first arc of the first updated digital pattern file to generate a second updated digital pattern file;

comparing the second updated digital pattern file with the first updated digital pattern file;

replacing a first cell of the second updated digital pattern file with an alternative version of the first cell to generate a third updated digital pattern file;

comparing the third updated digital pattern file with the second updated digital pattern file;

converting one or more polygons within the third updated digital pattern file to one or more quad polygons to generate an optimized digital pattern file; and comparing the optimized digital pattern file with the third updated digital pattern file.

2. The method of claim 1, wherein removing redundant cells from the digital pattern file comprises:

identifying a first cell of the digital pattern file that is equivalent to a second cell of the digital pattern file replacing the second cell.

3. The method of claim 2, wherein removing redundant cells from the digital pattern file further comprises:

replacing the second cell of the digital pattern file with the first cell of the digital pattern file.

4. The method of claim 1, wherein comparing the first updated digital pattern file with the digital pattern file comprises:

performing a cell comparison of the first updated digital pattern file with the digital pattern file and comparing an output of the comparison to an error threshold.

5. The method of claim 1, wherein comparing the second updated digital pattern file with the first updated digital pattern file comprises:

determining a difference between the first arc and a reduced vertex first arc that is created by reducing the number of vertexes of the first arc; and comparing the difference to a threshold.

6. The method of claim 1, comparing the third updated digital pattern file with the second updated digital pattern file comprises:

performing a cell comparison of the third updated digital pattern file with the second updated digital pattern file.

7. The method of claim 1, wherein comparing the optimized digital pattern file with the third updated digital pattern file comprises:

identifying a difference between the optimized digital pattern file and the third updated digital pattern file; and comparing the difference to a threshold.

8. A digital pattern generation system for a digital lithography device, the system comprising:

a memory comprising a digital pattern file; and a controller coupled to the memory, the controller configured to:

remove redundant cells from the digital pattern file to generate a first updated digital pattern file;

compare the first updated digital pattern file with the digital pattern file;

reduce a number of vertexes of a first arc of the first updated digital pattern file to generate a second updated digital pattern file;

compare the second updated digital pattern file with the first updated digital pattern file;

replace a first cell of the second updated digital pattern file with an alternative version of the first cell to generate a third updated digital pattern file;

compare the third updated digital pattern file with the second updated digital pattern file;

convert one or more polygons within the third updated digital pattern file to quad polygons to generate an optimized digital pattern file; and compare the optimized digital pattern file with the third updated digital pattern file.

9. The system of claim 8, wherein removing redundant cells from the digital pattern file comprises:

identifying a first cell of the digital pattern file that is equivalent to a second cell of the digital pattern file replacing the second cell of the digital pattern file with the first cell of the digital pattern file.

10. The system of claim 9, wherein removing redundant cells from the digital pattern file further comprises:

replacing the second cell of the digital pattern file with the first cell of the digital pattern file.

11. The system of claim 8, wherein comparing the first updated digital pattern file with the digital pattern file comprises:

performing a cell comparison of the first updated digital pattern file with the digital pattern file.

12. The system of claim 8, wherein comparing the second updated digital pattern file with the first updated digital pattern file comprises:

determining a difference between the first arc and a reduced vertex first arc that is created by reducing the number of vertexes of the first arc and the first are; and comparing the difference to a threshold.

13. The system of claim 8, comparing the third updated digital pattern file with the second updated digital pattern file comprises:

performing a cell comparison of the third updated digital pattern file with the second updated digital pattern file.

14. The system of claim 8, wherein comparing the optimized digital pattern file with the third updated digital pattern file comprises:

identifying a difference between the optimized digital pattern file and the third updated digital pattern file; and comparing the difference to a threshold.

15. A computer program product for generating an optimized digital pattern file, the computer program product comprising:

a computer-readable storage medium having computer-readable program code embodied therewith, the computer-readable program code executable by one or more computer processors to:

remove redundant cells from a digital pattern file to generate a first updated digital pattern file;

compare the first updated digital pattern file with the digital pattern file;

reduce a number of vertexes of a first arc of the first updated digital pattern file to generate a second updated digital pattern file;

compare the second updated digital pattern file with the first updated digital pattern file;

replace a first cell of the second updated digital pattern file with an alternative version of the first cell to generate a third updated digital pattern file;

compare the third updated digital pattern file with the second updated digital pattern file;

convert one or more polygons within the third updated digital pattern file to one or more quad polygons to generate the optimized digital pattern file; and compare the optimized digital pattern file with the third updated digital pattern file.

16. The computer program product of claim 15, wherein removing redundant cells from the digital pattern file comprises:

identifying a first cell of the digital pattern file that is equivalent to a second cell of the digital pattern file; and
replacing the second cell of the digital pattern file with the first cell of the digital pattern file.

17. The computer program product of claim 15, wherein comparing the first updated digital pattern file with the digital pattern file comprises:
performing a cell comparison of the first updated digital pattern file with the digital pattern file performing a cell comparison of the third updated digital pattern file with the second updated digital pattern file.

18. The computer program product of claim 15, wherein comparing the second updated digital pattern file with the first updated digital pattern file comprises:
determining a difference between the first arc and a reduced vertex first arc that is created by reducing the number of vertexes of the first arc; and
comparing the difference to a threshold.

19. The computer program product of claim 15, comparing the third updated digital pattern file with the second updated digital pattern file comprises:
performing a cell comparison of the third updated digital pattern file with the second updated digital pattern file.

20. The computer program product of claim 15, wherein comparing the optimized digital pattern file with the third updated digital pattern file comprises:
identifying a difference between the optimized digital pattern file and the third updated digital pattern file; and
comparing the difference to a threshold.

* * * * *